(12) United States Patent
Hong et al.

(10) Patent No.: US 11,489,529 B2
(45) Date of Patent: Nov. 1, 2022

(54) SEMICONDUCTOR APPARATUS AND DATA PROCESSING SYSTEM INCLUDING THE SEMICONDUCTOR APPARATUS

(71) Applicant: SK hynix Inc., Icheon-si (KR)

(72) Inventors: Gi Moon Hong, Icheon-si (KR); Dae Han Kwon, Icheon-si (KR); Kyu Young Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 106 days.

(21) Appl. No.: 17/159,952

(22) Filed: Jan. 27, 2021

(65) Prior Publication Data

US 2022/0077862 A1 Mar. 10, 2022

(30) Foreign Application Priority Data

Sep. 8, 2020 (KR) .......................... 10-2020-0114428

(51) Int. Cl.
*H03L 7/081* (2006.01)
*H03L 7/085* (2006.01)
*G06F 1/08* (2006.01)
*G11C 7/22* (2006.01)
*G06F 3/06* (2006.01)

(52) U.S. Cl.
CPC .............. *H03L 7/0812* (2013.01); *G06F 1/08* (2013.01); *G06F 3/0604* (2013.01); *G06F 3/0659* (2013.01); *G06F 3/0673* (2013.01); *G11C 7/222* (2013.01); *H03L 7/085* (2013.01)

(58) Field of Classification Search
CPC ......... H03L 7/0812; H03L 7/085; G06F 1/08; G06F 3/0604; G06F 3/0659; G06F 3/0673; G11C 7/222
See application file for complete search history.

(56) References Cited

U.S. PATENT DOCUMENTS

| | | | |
|---|---|---|---|
| 6,522,182 B2 * | 2/2003 | Tomita .................... | G11C 7/222 327/158 |
| 2006/0188051 A1 * | 8/2006 | Donnelly .............. | H03L 7/0816 375/371 |
| 2010/0117694 A1 * | 5/2010 | Kim .......................... | H03L 7/10 327/158 |
| 2010/0148842 A1 * | 6/2010 | Yoon ........................ | G11C 7/22 327/295 |
| 2019/0172509 A1 | 6/2019 | Kang et al. | |
| 2019/0379369 A1 * | 12/2019 | Seo .......................... | H03K 5/19 |
| 2021/0057016 A1 * | 2/2021 | Shin ..................... | G11C 11/4087 |
| 2021/0255659 A1 * | 8/2021 | Chen .......................... | G06F 1/06 |

\* cited by examiner

*Primary Examiner* — Janice N Tieu
(74) *Attorney, Agent, or Firm* — William Park & Associates Ltd.

(57) ABSTRACT

A semiconductor apparatus receives a first clock signal and a second clock signal. The semiconductor apparatus configured to perform a training operation internally, the training operation being an operation of internally correcting a phase difference between the first clock signal and the second clock signal by dividing the first clock signal to generate multi-phase signals, detecting phase difference between the second clock signal and the multi-phase signals, and adjusting phases of the multi-phase signals according to a result of the detecting of the phase difference.

24 Claims, 7 Drawing Sheets

| | WCK Phase lag | PD8A/B OCLK7/+Δ | PD1A/B OCLK0/+Δ | PD2A/B OCLK1/+Δ | PD3A/B OCLK2/+Δ | PD4A/B OCLK3/+Δ | PD5A/B OCLK4/+Δ | PD6A/B OCLK5/+Δ | PD7A/B OCLK6/+Δ | Shift | Shift Result |
|---|---|---|---|---|---|---|---|---|---|---|---|
| Case0 | 0 | H/H | H/L | L/L | L/L | L/L | L/H | H/H | H/H | 0 | 0+0=0 |
| Case1 | 22.5 | H | L | L | L | L | H | H | H | 337.5 | 22.5+337.5=360=0 |
| Case2 | 45 | H/L | L/L | L/L | L/L | L/H | H/H | H/H | H/H | 315 | 45+315=360=0 |
| Case3 | 67.5 | L | L | L | L | H | H | H | H/L | 292.5 | 67.5+292.5=360 |
| Case4 | 90 | L | L | L | L/H | H | H | H | L | 270 | 90+270=360 |
| Case5 | 112.5 | L | L | L | H | H | H | H/L | L | 257.5 | 112.5+257.5=360 |
| Case6 | 135 | L | L | L/H | H | H | H | L | L | 225 | 135+225=360 |
| Case7 | 157.5 | L | L | H | H | H | H/L | L | L | 202.5 | 157.5+202.5=360 |
| Case8 | 180 | L | L/H | H | H | H | L | L | L | 180 | 180+180=360 |
| Case9 | 202.5 | L | H | H | H | H/L | L | L | L | 157.5 | 202.5+157.5=360 |
| Case10 | 225 | L/H | H | H | H | L | L | L | L | 135 | 225+135=360 |
| Case11 | 257.5 | H | H | H | H/L | L | L | L | L/H | 112.5 | 257.5+112.5=360 |
| Case12 | 270 | H | H | H | L | L | L | L | H | 90 | 270+90=360 |
| Case13 | 292.5 | H | H | H/L | L | L | L | L/H | H | 67.5 | 292.5+67.5=360 |
| Case14 | 315 | H | H | L | L | L | L/H | H | H | 45 | 315+45=360 |
| Case15 | 337.5 | H | H | L | L | L | L/H | H | H | 22.5 | 337.5+22.5=360 |

SEMICONDUCTOR APPARATUS AND DATA PROCESSING SYSTEM INCLUDING THE SEMICONDUCTOR APPARATUS

CROSS-REFERENCES TO RELATED APPLICATION

The present application claims priority under 35 U.S.C. § 119(a) to Korean application number 10-2020-0114428, filed on Sep. 8, 2020, in the Korean Intellectual Property Office, which is incorporated herein by reference in its entirety as set forth in full.

BACKGROUND

1. Technical Field

Various embodiments generally relate to a semiconductor circuit, and, more particularly, to a semiconductor apparatus and a data processing system including the semiconductor apparatus.

2. Related Art

Figure 1:
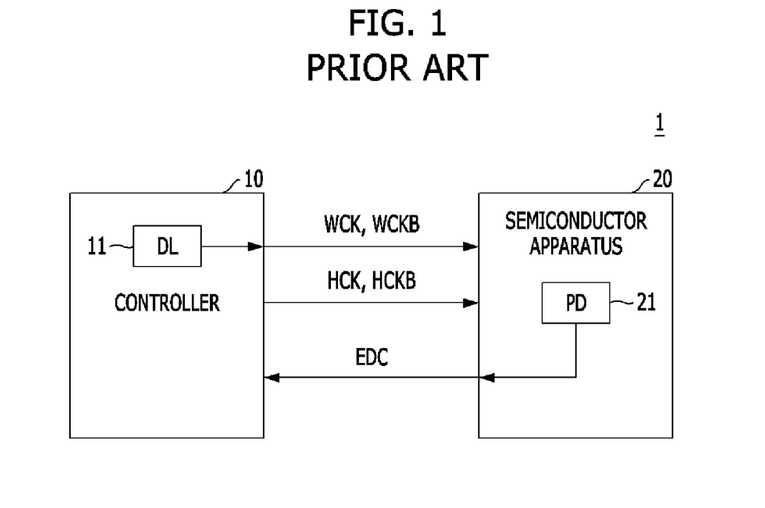
FIG. 1 is a diagram illustrating a configuration of a data processing system according to a prior art.
Figure 2:
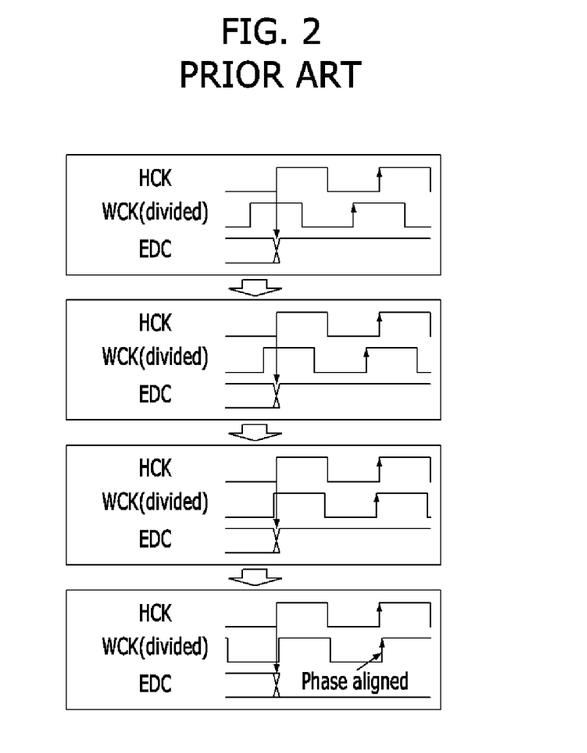
FIG. 2 is a timing diagram illustrating a training scheme according to a prior art.

FIG. 1 is a diagram illustrating a configuration of a data processing system 1 according to a prior art. FIG. 2 is a timing diagram illustrating a training scheme according to a prior art.

Referring to FIG. 1, the data processing system 1 may include a controller 10 and a semiconductor apparatus 20.

The controller 10 has a delay line 11, on which it is possible to adjust delay time.

The controller 10 is a Graphic Processing Unit (GPU) or a Central Processing Unit (CPU).

The semiconductor apparatus 20 has a phase detector 21.

The semiconductor apparatus 20 is a volatile memory apparatus, a nonvolatile memory apparatus or a memory apparatus, in which volatile memories and nonvolatile memories are combined.

The controller 10 provides the semiconductor apparatus 20 with a first clock signal WCK/WCKB and a second clock signal HCK/HCKB.

The first clock signal WCK/WCKB is utilized during a data write operation of the semiconductor apparatus 20 and is referred to as a data clock signal.

The second clock signal HCK/HCKB is utilized during base operations of the controller 10 and the semiconductor apparatus 20 and is referred to as a system clock signal.

The first clock signal WCK/WCKB and the second clock signal HCK/HCKB have different periods and/or different frequencies.

For a precise operation of transmitting and receiving data between the controller 10 and the semiconductor apparatus 20, essential is a training operation to synchronize phases of the first clock signal WCK/WCKB and the second clock signal HCK/HCKB with each other.

Hereinafter, a training operation according to the prior art will be described with reference to FIGS. 1 and 2.

The semiconductor apparatus 20 detects, through the phase detector 21, a phase of the first clock signal WCK/WCKB with reference to the second clock signal HCK/HCKB. The semiconductor apparatus 20 transmits a result of the detection to the controller 10 through an Error Detection Code (EDC) pin.

The controller 10 controls the delay line 11 according to information transmitted through the EDC pin thereby adjusting the phase of the first clock signal WCK/WCKB.

When phase difference between the first clock signal WCK/WCKB and the second clock signal HCK/HCKB falls within a target range through repetition of the above-described process, the training operation ends.

SUMMARY

In an embodiment, a semiconductor apparatus may be configured to receive a first clock signal and a second clock signal. The semiconductor apparatus may be configured to perform a training operation internally within the semiconductor apparatus without transmitting a signal to a controller for execution of the training operation, the training operation being an operation of internally correcting a phase difference between the first clock signal and the second clock signal by dividing the first clock signal to generate multi-phase signals, detecting phase difference between the second clock signal and the multi-phase signals, and adjusting phases of the multi-phase signals according to a result of the detecting of the phase difference.

In an embodiment, a semiconductor apparatus may include a dividing circuit, a phase detecting circuitry, a phase control circuit and a phase adjusting circuit. The dividing circuit may be configured to divide a first clock signal, received externally from the semiconductor apparatus, to generate multi-phase signals. The phase detecting circuitry may be configured to detect phases of the multi-phase signals with reference to a second clock signal, received externally from the semiconductor apparatus, to generate a plurality of phase detection signals. The phase control circuit may be configured to generate a phase control signal according to the plurality of phase detection signals. The phase adjusting circuit may be configured to adjust the phases of the multi-phase signals according to the phase control signal to generate phase adjustment signals.

In an embodiment, a data processing system may include a controller and a semiconductor apparatus. The controller may be configured to output a first clock signal and a second clock signal. The semiconductor apparatus may include a self-training circuit. The self-training circuit may be configured to perform a self-training operation internally within the semiconductor apparatus without transmitting a signal to a controller for execution of the training operation, the self-training operation being an operation of internally correcting a phase difference between the first clock signal and the second clock signal by dividing the first clock signal to generate multi-phase signals, detecting phase difference between the second clock signal and the multi-phase signals, and adjusting phases of the multi-phase signals according to a result of the detecting of the phase difference.

DETAILED DESCRIPTION

Referring to FIGS. 1 and 2 above, the above-described training operation according to the prior art has the following problems.

First, hardware and software are additionally required for the controller 10 to adjust the phase of the first clock signal WCK/WCKB. The controller 10 basically requires resources of hardware and software for the control of the semiconductor apparatus 20 besides the training operation. Therefore, the additional resources for the training operation may intensify burden of hardware and software.

Second, the controller 10 asynchronously adjusts the phase of the first clock signal WCK/WCKB, which may lower accuracy of the training operation.

Third, it is the ECD pin through which the result of phase detection is transferred. Therefore, it may take an increased amount of time to transfer the result of phase detection.

Hereinafter, embodiments will be described in detail with reference to the accompanying drawings.

According to an embodiment, provided are a semiconductor apparatus capable of a prompt and accurate training operation with reduced workload (i.e., burden of hardware and software) of a controller for a training operation, and a data processing system including the semiconductor apparatus.

Figure 3:
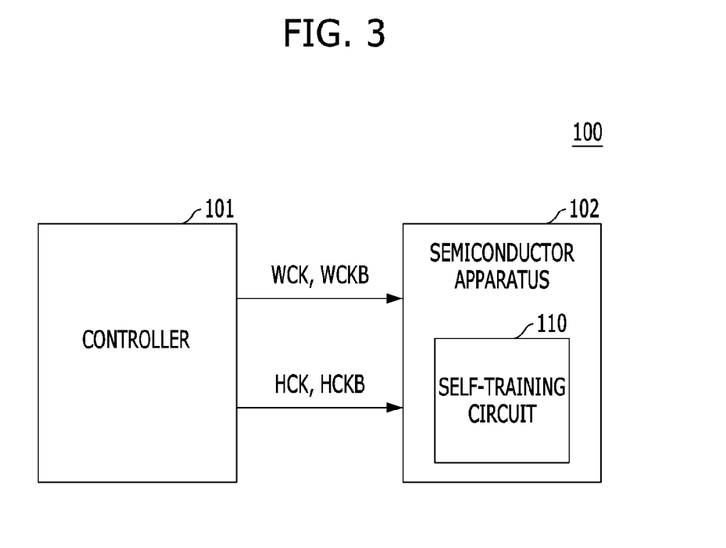
FIG. 3 is a diagram illustrating a configuration of a data processing system according to an embodiment.

FIG. 3 is a diagram illustrating a configuration of a data processing system 100 according to an embodiment.

Referring to FIG. 3, the data processing system 100 may include a controller 101 and a semiconductor apparatus 102.

The controller 101 may be the Graphic Processing Unit (GPU) or the Central Processing Unit (CPU).

The controller 101 may provide the semiconductor apparatus 102 with a first clock signal WCK/WCKB and a second clock signal HCK/HCKB.

The first clock signal WCK/WCKB may be utilized during a data write operation of the semiconductor apparatus 102.

The second clock signal HCK/HCKB may be utilized for base operations of the controller 101 and the semiconductor apparatus 102.

The first clock signal WCK/WCKB and the second clock signal HCK/HCKB may have different periods and/or different frequencies.

The semiconductor apparatus 102 may be a volatile memory apparatus, a nonvolatile memory apparatus or a memory apparatus, in which volatile memories and nonvolatile memories are combined.

The semiconductor apparatus 102 may perform a training operation by itself. For example, in an embodiment, the semiconductor apparatus 102 may perform a training operation internally within the semiconductor apparatus without transmitting a signal (i.e., EDC) to the controller 101 during the training operation until the training operation has completed. In an embodiment, the semiconductor apparatus 102 may perform the training operation by not transmitting a signal (i.e., EDC, etc.) to the controller or receiving a signal from the controller for execution of the training operation, in a predetermined time-section. The training operation may be an operation of internally correcting a phase difference between the first clock signal WCK/WCKB and the second clock signal HCK/HCKB, which are provided externally from the semiconductor device. The training operation may include operations of dividing the first clock signal WCK/WCKB to generate multi-phase signals, detecting phase difference between the second clock signal HCK/HCKB and the multi-phase signals, and adjusting phases of the multi-phase signals according to a result of the detecting of the phase difference.

The training operation that the semiconductor apparatus 102 performs by itself may be referred to as a self-training operation.

The semiconductor apparatus 102 may include a self-training circuit 110 for the self-training operation.

The self-training operation may be performed without an external command in a predetermined time-section, for example, in an initialization operation section of the semiconductor apparatus 102. In an embodiment, an external command is a command received externally from the semiconductor apparatus. The word "predetermined" as used herein with respect to a parameter, such as a predetermined time-section and predetermined phase difference, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The time-section in which the self-training operation is performed may be determined through mode register setting and so forth.

The self-training operation may be performed whenever an external command is provided. For example, the self-training operation may be performed whenever the controller 101 provides a training command to the semiconductor apparatus 102.

The main agent of generating the training command, e.g., the controller 101 may only provide the training command to the semiconductor apparatus 102. The self-training operation may be performed by the semiconductor apparatus 102. The semiconductor apparatus 102 might not provide the controller 101 with information about performing or completing the self-training operation.

Figure 4:
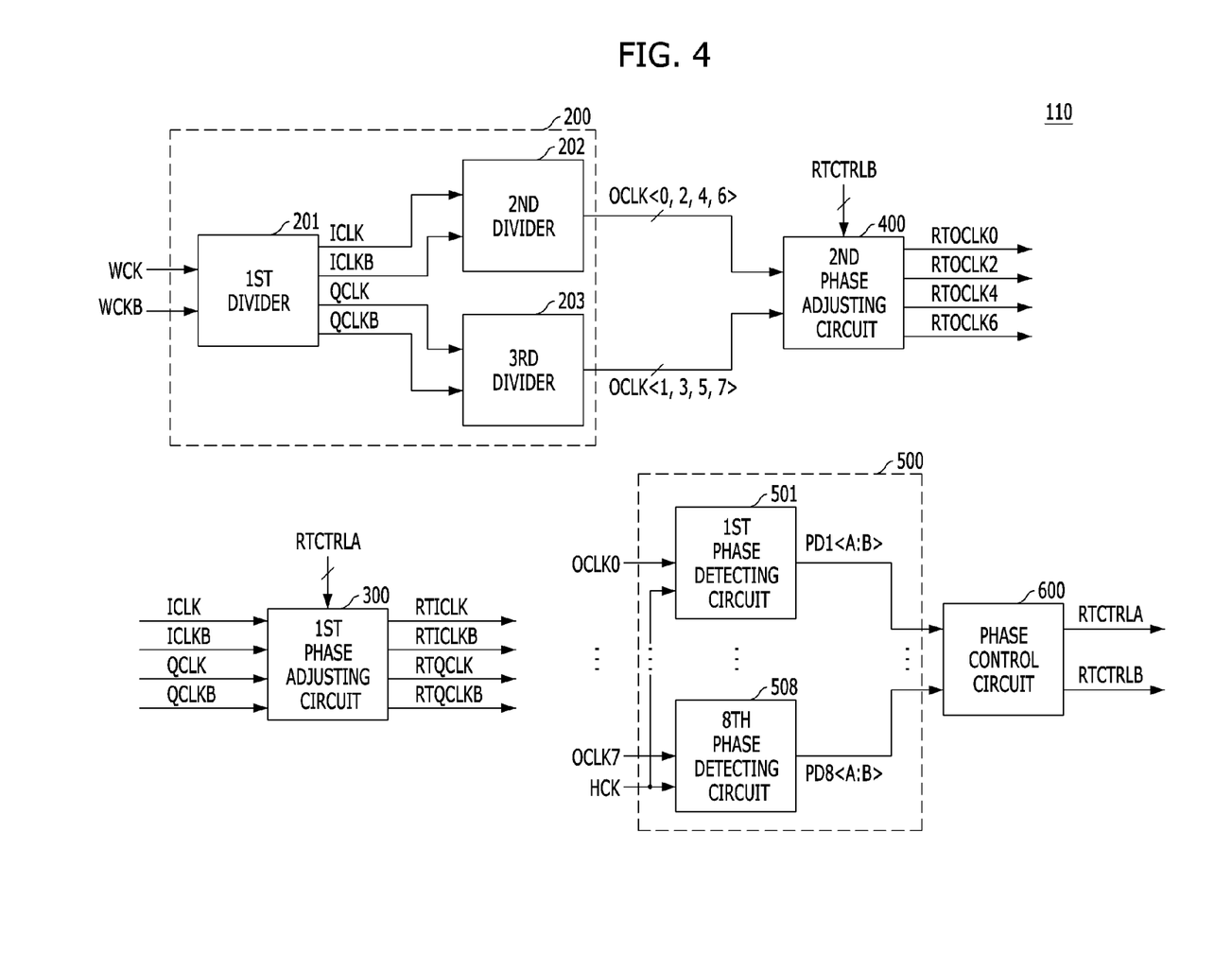
FIG. 4 is a diagram illustrating a configuration of a self-training circuit according to an embodiment.

FIG. 4 is a diagram illustrating a configuration of the self-training circuit 110 according to an embodiment.

Referring to FIG. 4, the self-training circuit 110 may include a dividing circuit 200, a first phase adjusting circuit 300, a second phase adjusting circuit 400, a phase detecting circuitry 500 and a phase control circuit 600.

The dividing circuit 200 may divide the first clock signal WCK/WCKB to generate the multi-phase signals.

The dividing circuit 200 may divide the first clock signal WCK/WCKB to generate first multi-phase signals ICLK, ICLKB, QCLK and QCLKB and second multi-phase signals OCLK<0:7>.

The first multi-phase signals ICLK, ICLKB, QCLK and QCLKB and the second multi-phase signals OCLK<0:7> may be utilized in data read/write operations of the semiconductor apparatus 102.

The dividing circuit 200 may include at least one divider, for example, a first divider 201, a second divider 202, and a third divider 203.

The first divider 201 may divide the first clock signal WCK/WCKB to generate the first multi-phase signals ICLK, ICLKB, QCLK and QCLKB.

The first divider 201 may have signals transition to different levels from one another according to a first edge (e.g., a rising edge) of each of the first clock signal WCK/WCKB and may output the transitioned signals as the first multi-phase signals ICLK, ICLKB, QCLK and QCLKB.

The first divider 201 may have a signal transition to a high level and another signal transition to a low level, according to the first edge (e.g., the rising edge) of the clock signal WCK of the first clock signal WCK/WCKB to output the transitioned signals respectively as the multi-phase signals ICLK and ICLKB. Therefore, the multi-phase signals ICLK and ICLKB may have a half frequency of the clock signal WCK and may have a predetermined phase difference from each other.

The first divider 201 may have a signal transition to a high level and another signal transition to a low level, according to the first edge (e.g., the rising edge) of the clock signal WCKB of the first clock signal WCK/WCKB to output the transitioned signals respectively as the multi-phase signals QCLK and QCLKB. Therefore, the multi-phase signals QCLK and QCLKB may have a half frequency of the clock signal WCKB and may have a predetermined phase difference from each other.

The second divider 202 may divide some signals, for example, the multi-phase signals ICLK and ICLKB among the first multi-phase signals ICLK, ICLKB, QCLK and QCLKB to generate some signals, for example, the multi-phase signals OCLK<0, 2, 4, 6> among the second multi-phase signals OCLK<0:7>.

The third divider 203 may divide remaining signals, for example, the multi-phase signals QCLK and QCLKB among the first multi-phase signals ICLK, ICLKB, QCLK and QCLKB to generate remaining signals, for example, the multi-phase signals OCLK<1, 3, 5, 7> among the second multi-phase signals OCLK<0:7>.

Each of the second divider 202 and the third divider 203 may operate in the same way as the first divider 201.

The dividing circuit 200 comprising the three dividers 201, 202 and 203 is an example. It is possible to increase a number of dividers to configure the dividing circuit 200 to raise resolution for phase detection and to decrease the number of dividers to configure the dividing circuit 200 in consideration of a layout aspect.

The first phase adjusting circuit 300 may adjust the phases of the first multi-phase signals ICLK, ICLKB, QCLK and QCLKB according to a first phase control signal RTCTRLA to generate first phase adjustment signals RTICLK, RTICLKB, RTQCLK and RTQCLKB.

The second phase adjusting circuit 400 may adjust the phases of the second multi-phase signals OCLK<0:7> according to a second phase control signal RTCTRLB to generate second phase adjustment signals RTOCLK0, RTOCLK2, RTOCLK4 and RTOCLK6.

Each of the first phase control signal RTCTRLA and the second phase control signal RTCTRLB may include a plurality of signal bits.

The phase detecting circuitry 500 may detect the phases of the multi-phase signals output from the dividing circuit 200 with reference to a second clock signal HCK.

The phase detecting circuitry 500 may detect the phases of the second multi-phase signals OCLK<0:7> with reference to the second clock signal HCK to generate phase detection signals PD<1:8> <A:B>.

The phase detecting circuitry 500 may include first to eighth phase detecting circuits 501 to 508.

The first phase detecting circuit 501 may generate the phase detection signals PD1<A:B> according to the second multi-phase signal OCLK0 and the second clock signal HCK.

The second phase detecting circuit 502 may generate the phase detection signals PD2<A:B> according to the second multi-phase signal OCLK1 and the second clock signal HCK.

The third phase detecting circuit 503 may generate the phase detection signals PD3<A:B> according to the second multi-phase signal OCLK2 and the second clock signal HCK.

The fourth phase detecting circuit 504 may generate the phase detection signals PD4<A:B> according to the second multi-phase signal OCLK3 and the second clock signal HCK.

The fifth phase detecting circuit 505 may generate the phase detection signals PD5<A:B> according to the second multi-phase signal OCLK4 and the second clock signal HCK.

The sixth phase detecting circuit 506 may generate the phase detection signals PD6<A:B> according to the second multi-phase signal OCLK5 and the second clock signal HCK.

The seventh phase detecting circuit 507 may generate the phase detection signals PD7<A:B> according to the second multi-phase signal OCLK6 and the second clock signal HCK.

The eighth phase detecting circuit 508 may generate the phase detection signals PD8<A:B> according to the second multi-phase signal OCLK7 and the second clock signal HCK.

The phase control circuit 600 may generate the first phase control signal RTCTRLA and the second phase control signal RTCTRLB according to the plurality of phase detection signals PD<1:8> <A:B>.

The phase control circuit 600 may be configured by a state machine.

Figure 5:
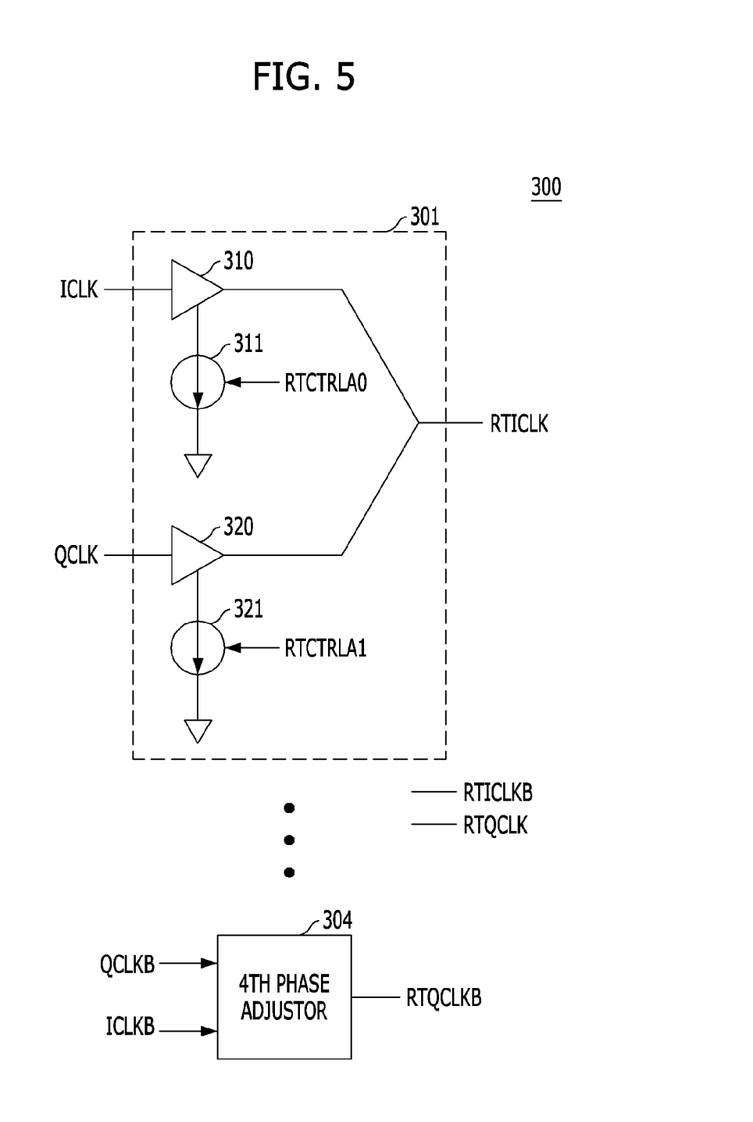
FIG. 5 is a diagram illustrating a configuration of a first phase adjusting circuit illustrated in FIG. 4.

FIG. 5 is a diagram illustrating a configuration of the first phase adjusting circuit 300 illustrated in FIG. 4.

Referring to FIG. 5, the first phase adjusting circuit 300 may include a plurality of phase adjustors, for example, first to fourth phase adjustors 301 to 304.

The first phase adjustor 301 may generate one (for example, the first phase adjustment signal RTICLK) among the first phase adjustment signals RTICLK, RTICLKB, RTQCLK and RTQCLKB according to two first multi-phase signals (for example, the first multi-phase signals ICLK and QCLK) selected to have predetermined phase difference among the first multi-phase signals ICLK, ICLKB, QCLK and QCLKB.

The first phase adjustor 301 may include a first buffer 310, a first variable current source 311, a second buffer 320 and a second variable current source 321.

The first buffer 310 may drive and output the first multi-phase signal ICLK according to its variable driving strength (hereinafter, strength).

The first variable current source 311 may adjust an amount of current output from the first variable current source 311 according to the first phase control signal RTCTRLA0 to adjust the strength of the first buffer 310.

The second buffer 320 may drive and output the first multi-phase signal QCLK according to its variable driving strength.

The second variable current source 321 may adjust an amount of current output from the second variable current source 321 according to the first phase control signal RTCTRLA1 to adjust the strength of the second buffer 320.

Output nodes of the first buffer 310 and the second buffer 320 may be coupled to a common node. The first phase adjustment signal RTICLK may be output through the common node.

The second phase adjustor 302 may generate another one (for example, the first phase adjustment signal RTICLKB) among the first phase adjustment signals RTICLK, RTICLKB, RTQCLK and RTQCLKB according to two first multi-phase signals (for example, the multi-phase signals ICLKB and QCLKB) selected to have predetermined phase difference among the first multi-phase signals ICLK, ICLKB, QCLK and QCLKB.

The third phase adjustor 303 may generate another one (for example, the first phase adjustment signal RTQCLK) among the first phase adjustment signals RTICLK, RTICLKB, RTQCLK and RTQCLKB according to two first multi-phase signals (for example, the multi-phase signals QCLK and ICLK) selected to have predetermined phase difference among the first multi-phase signals ICLK, ICLKB, QCLK and QCLKB.

The fourth phase adjustor 304 may generate another one (for example, the first phase adjustment signal RTQCLKB) among the first phase adjustment signals RTICLK, RTICLKB, RTQCLK and RTQCLKB according to two multi-phase signals (for example, the first multi-phase signals QCLKB and ICLKB) selected to have predetermined phase difference among the first multi-phase signals ICLK, ICLKB, QCLK and QCLKB.

Each of the second to fourth phase adjustors 302 to 304 may be configured in the same way as the first phase adjustor 301.

Figure 6:
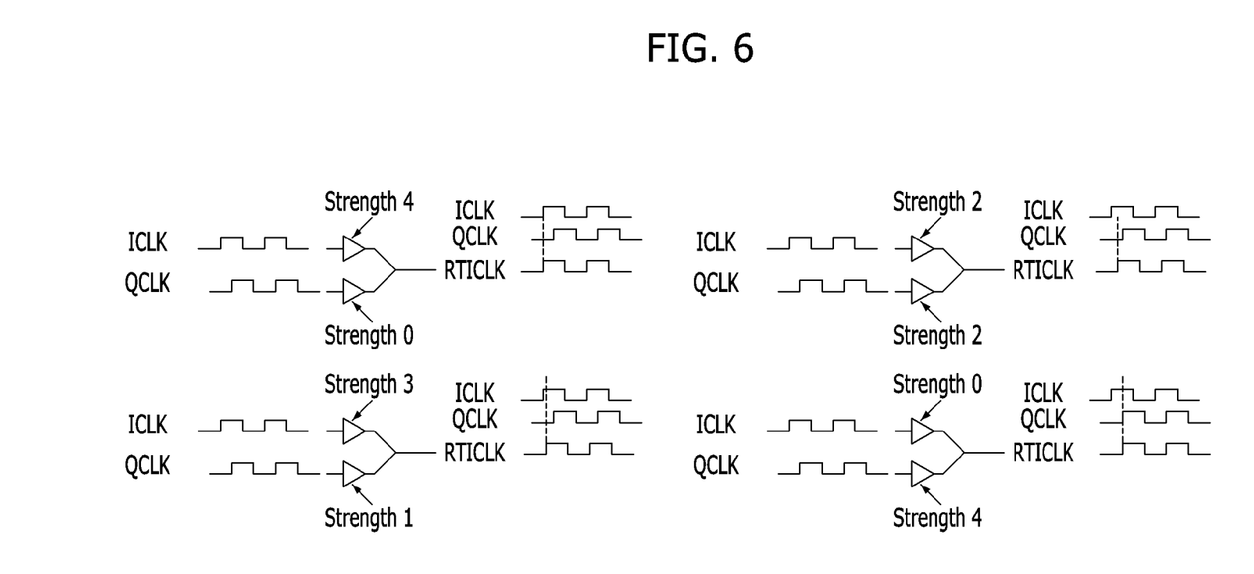
FIG. 6 is a diagram illustrating an example of an operation of a first phase adjustor illustrated in FIG. 5.

FIG. 6 is a diagram illustrating an example of an operation of the first phase adjustor 301 illustrated in FIG. 5.

The strength of the first buffer 310 of the first phase adjustor 301 may be varied by the first phase control signal RTCTRLA0. The strength of the second buffer 320 of the first phase adjustor 301 may be varied by the first phase control signal RTCTRLA1.

For example, when the strength of the first buffer 310 is determined as '4' and the strength of the second buffer 320 is determined as '0', the first phase adjustment signal RTICLK may have the same phase as the first multi-phase signal ICLK.

For example, when the strength of the first buffer 310 is determined as '3' and the strength of the second buffer 320 is determined as '1', the first phase adjustment signal RTICLK may have a phase of the first multi-phase signal ICLK, which is delayed by an amount of a quarter (¼) of the phase difference between the multi-phase signals ICLK and QCLK.

For example, when the strength of the first buffer 310 is determined as '2' and the strength of the second buffer 320 is determined as '2', the first phase adjustment signal RTICLK may have a phase of the first multi-phase signal ICLK, which is delayed by an amount of a half (½) of the phase difference between the multi-phase signals ICLK and QCLK.

For example, when the strength of the first buffer 310 is determined as '0' and the strength of the second buffer 320 is determined as '4', the first phase adjustment signal RTICLK may have the same phase as the first multi-phase signal QCLK.

The second phase adjusting circuit 400 may be configured in the same way as the first phase adjusting circuit 300.

The first to fourth phase adjustors of the second phase adjusting circuit 400 may receive respective pairs OCLK0/OCLK1, OCLK2/OCLK3, OCLK4/OCLK5, OCLK6/OCLK7 of the second multi-phase signals OCLK<0:7> to generate the respective second phase adjustment signals RTOCLK0, RTOCLK2, RTOCLK4 and RTOCLK6.

Figure 7:
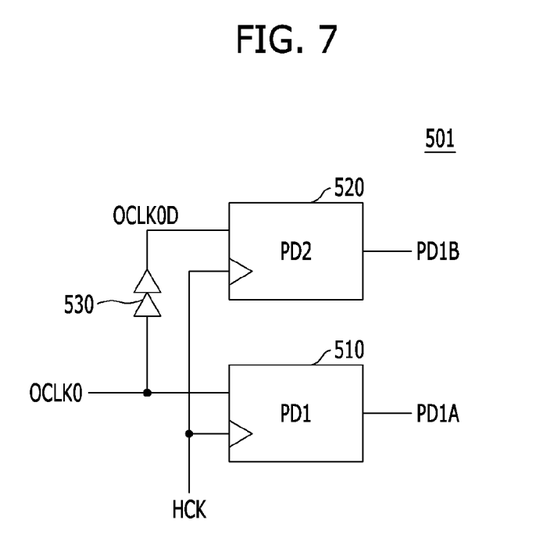
FIG. 7 is a diagram illustrating a configuration of a first phase detecting circuit illustrated in FIG. 4.

FIG. 7 is a diagram illustrating a configuration of the first phase detecting circuit 501 illustrated in FIG. 4.

Referring to FIG. 7, the first phase detecting circuit 501 may include a first phase detector (PD1) 510, a second phase detector (PD2) 520 and a delayer 530.

The first phase detecting circuit 510 may detect the phase of the second multi-phase signal OCLK0 according to the second clock signal HCK to generate a phase detection signal PD1A.

The delayer 530 may delay the second multi-phase signal OCLK0 to generate a delayed second multi-phase signal OCLK0D.

The second phase detecting circuit 520 may detect the phase of the delayed second multi-phase signal OCLK0D according to the second clock signal HCK to generate a phase detection signal PD1B.

Each of the second to eighth phase detection circuits 502 to 508 may be configured in the same way as the first phase detecting circuit 501.

Figure 8:
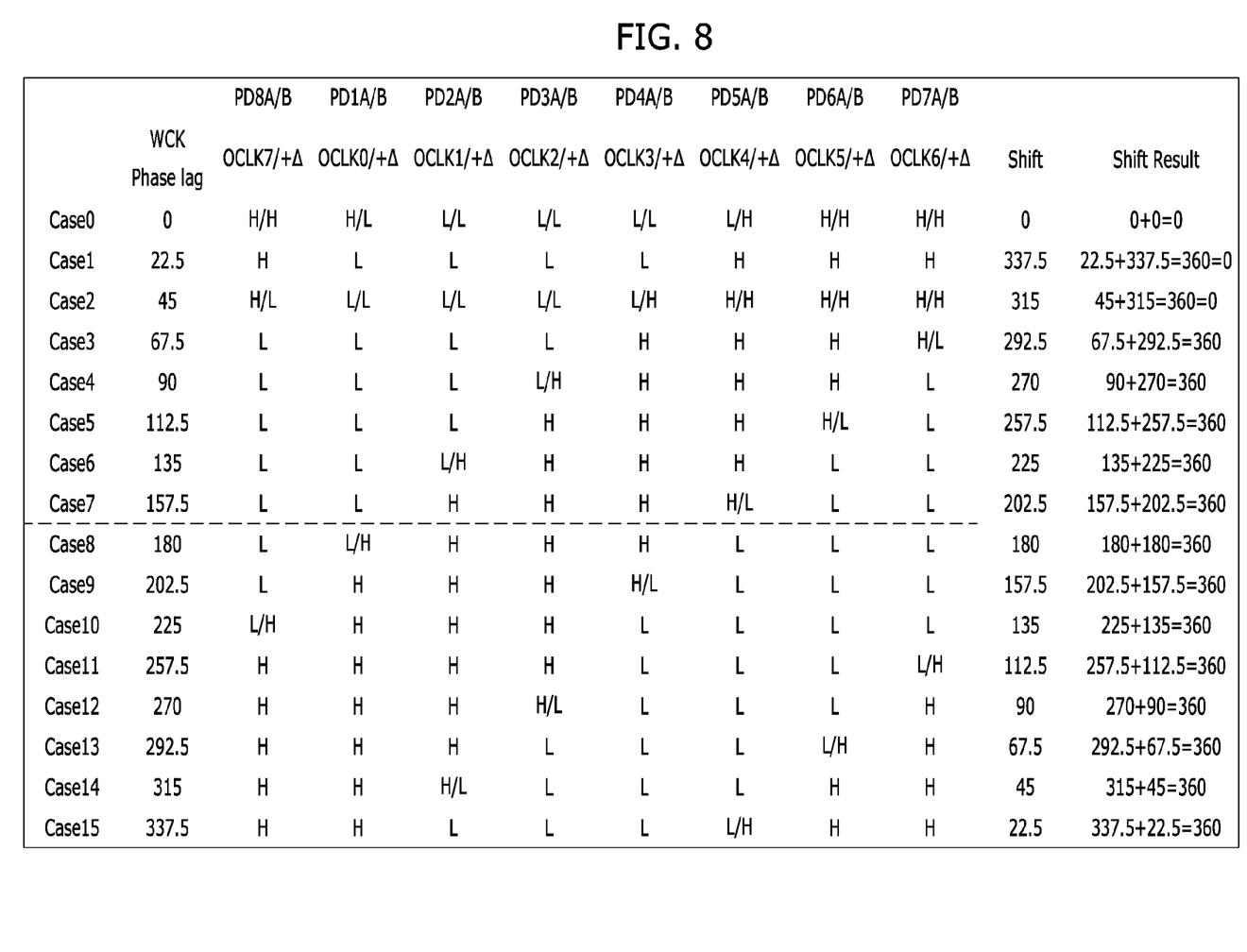
FIG. 8 is a diagram illustrating an operation of a phase control circuit illustrated in FIG. 4.

FIG. 8 is a diagram illustrating an operation of the phase control circuit 600 illustrated in FIG. 4.

The phase control circuit 600 may be configured by a state machine.

The phase control circuit 600 may determine phase difference of the first clock signal WCK with reference to the second clock signal HCK according to values of the plurality of phase detection signals PD<1:8> <A:B>. The phase control circuit 600 may generate the first phase control signal RTCTRLA and the second phase control signal RTCTRLB for compensating the phase difference.

The plurality of the phase detection signals PD<1:8> <A:B> may be generated according to the second multi-phase signals OCLK<0:7> and the second multi-phase signals OCLK<0:7> may be the ones generated by dividing the first clock signal WCK. Therefore, the phase difference of the first clock signal WCK with reference to the second clock signal HCK may be determined according to the values of the plurality of phase detection signals PD<1:8> <A:B>.

The phase difference of the first clock signal WCK with reference to the second clock signal HCK may have various values, for example, values such as shown in Case0 to Case15.

As shown in Case0, when the phase difference of the first clock signal WCK with reference to the second clock signal HCK is '0°', the values of the plurality of phase detection signals PD<1:8> <A:B> may be respectively H/L, L/L, L/L, L/L, L/H, H/H, H/H and H/H.

According to the above-described values of the plurality of phase detection signals PD<1:8> <A:B>, the phase control circuit 600 may determine the phase difference of the first clock signal WCK with reference to the second clock signal HCK as '0'. That is, the phase control circuit 600 may determine the phase of the first clock signal WCK with reference to the second clock signal HCK to be within an error range.

When the phase difference of the first clock signal WCK with reference to the second clock signal HCK is '0', there may be no need to correct the phase of the first clock signal WCK.

In Case0, the phase control circuit 600 may generate the first phase control signal RTCTRLA and the second phase control signal RTCTRLB for setting, for example, the strength of the first buffer 310 to '4' and the strength of the second buffer 320 to '0', as described with reference to FIG. 6.

Therefore, the first phase adjusting circuit 300 may buffer the respective first multi-phase signals ICLK, ICLKB, QCLK and QCLKB according to the first phase control signal RTCTRLA to output the buffered first multi-phase signals ICLK, ICLKB, QCLK and QCLKB as the first phase adjustment signals RTICLK, RTICLKB, RTQCLK and RTQCLKB.

That is, by setting a weight value of the strength for the first multi-phase signal ICLK to a maximum value and setting a weight value of the strength for the first multi-phase signal QCLK to a minimum value, the first multi-phase signal ICLK may be output as the first phase adjustment signal RTICLK and, through the same way, the respective first multi-phase signals ICLKB, QCLK and QCLKB may be output as the respective first phase adjustment signals RTICLKB, RTQCLK and RTQCLKB.

The second phase adjusting circuit 400 may buffer the respective second multi-phase signals OCLK0, OCLK2, OCLK4 and OCLK6 among the second multi-phase signals OCLK<0:7> according to the second phase control signal RTCTRLB to output the buffered second multi-phase signals OCLK0, OCLK2, OCLK4 and OCLK6 as the second phase adjustment signals RTOCLK0, RTOCLK2, RTOCLK4 and RTOCLK6.

That is, by setting a weight value of the strength for the second multi-phase signal OCLK0 to a maximum value and setting a weight value of the strength for the second multi-phase signal OCLK1 to a minimum value, the second multi-phase signal OCLK0 may be output as the second phase adjustment signal RTOCLK0 and, through the same way, the respective second multi-phase signals OCLK2, OCLK4, OCLK6 may be output as the respective second phase adjustment signals RTOCLK2, RTOCLK4 and RTOCLK6.

As shown in Case1, when the phase difference of the first clock signal WCK with reference to the second clock signal HCK is '22.5°', the values of the plurality of phase detection signals PD<1:8> <A:B> may be respectively L, L, L, L, H, H, H and H.

According to the above-described values of the plurality of phase detection signals PD<1:8> <A:B>, the phase control circuit 600 may determine the phase difference of the first clock signal WCK with reference to the second clock signal HCK as '22.5°'. That is, the phase control circuit 600 may determine to shift the phase of the first clock signal WCK by an amount of '337.5° (360°−22.5°)'.

In Case1, the phase control circuit 600 may generate the first phase control signal RTCTRLA for generating the first phase adjustment signals RTICLK, RTICLKB, RTQCLK and RTQCLKB having the phases shifted by the amount of '337.5°' respectively with reference to the first multi-phase signals ICLK, ICLKB, QCLK and QCLKB.

In Case1, the phase control circuit 600 may generate the second phase control signal RTCTRLB for generating the second phase adjustment signals RTOCLK0, RTOCLK2, RTOCLK4 and RTOCLK6 having the phases shifted by the amount of '337.5°' respectively with reference to the second multi-phase signals OCLK0, OCLK2, OCLK4 and OCLK6 among the second multi-phase signals OCLK<0:7>.

According to the first phase control signal RTCTRLA, the first phase adjusting circuit 300 may generate the first phase adjustment signals RTICLK, RTICLKB, RTQCLK and RTQCLKB having the phases shifted by the amount of '337.5°' respectively with reference to the first multi-phase signals ICLK, ICLKB, QCLK and QCLKB.

According to the second phase control signal RTCTRLB, the second phase adjusting circuit 400 may generate the second phase adjustment signals RTOCLK0, RTOCLK2, RTOCLK4 and RTOCLK6 having the phases shifted by the amount of '337.5°' respectively with reference to the second multi-phase signals OCLK0, OCLK2, OCLK4 and OCLK6 among the second multi-phase signals OCLK<0:7>.

As shown in Case2, when the phase difference of the first clock signal WCK with reference to the second clock signal HCK is '45°', the values of the plurality of phase detection signals PD<1:8> <A:B> may be L/L, L/L, L/L, L/H, H/H, H/H, H/H and H/L.

According to the above-described values of the plurality of phase detection signals PD<1:8> <A:B>, the phase control circuit 600 may determine the phase difference of the first clock signal WCK with reference to the second clock signal HCK as '45°'. That is, the phase control circuit 600 may determine to shift the phase of the first clock signal WCK by an amount of '315° (360°−45°)'.

In Case2, the phase control circuit 600 may generate the first phase control signal RTCTRLA for generating the first phase adjustment signals RTICLK, RTICLKB, RTQCLK and RTQCLKB having the phases shifted by the amount of '315°' respectively with reference to the first multi-phase signals ICLK, ICLKB, QCLK and QCLKB.

In Case2, the phase control circuit 600 may generate the second phase control signal RTCTRLB for generating the second phase adjustment signals RTOCLK0, RTOCLK2, RTOCLK4 and RTOCLK6 having the phases shifted by the amount of '315°' respectively with reference to the second multi-phase signals OCLK0, OCLK2, OCLK4 and OCLK6 among the second multi-phase signals OCLK<0:7>.

According to the first phase control signal RTCTRLA, the first phase adjusting circuit 300 may generate the first phase adjustment signals RTICLK, RTICLKB, RTQCLK and RTQCLKB having the phases shifted by the amount of '315°' respectively with reference to the first multi-phase signals ICLK, ICLKB, QCLK and QCLKB.

According to the second phase control signal RTCTRLB, the second phase adjusting circuit 400 may generate the second phase adjustment signals RTOCLK0, RTOCLK2, RTOCLK4 and RTOCLK6 having the phases shifted by the amount of '315°' respectively with reference to the second multi-phase signals OCLK0, OCLK2, OCLK4 and OCLK6 among the second multi-phase signals OCLK<0:7>.

In the same way, the phase control circuit 600 in Case3 to Case15 may determine the phase difference of the first clock signal WCK with reference to the second clock signal HCK according to the values of the plurality of phase detection signals PD<1:8> <A:B>. That is, the phase control circuit 600 in Case3 to Case15 may determine the amount of phase, by which the first clock signal WCK is to be shifted, and may accordingly generate the first phase control signal RTCTRLA and the second phase control signal RTCTRLB.

While certain embodiments have been described above, it will be understood to those skilled in the art that the embodiments described are by way of example only. Accordingly, the semiconductor apparatus and data processing system including the semiconductor apparatus should not be limited based on the described embodiments. Rather, the semiconductor apparatus and data processing system including the semiconductor apparatus described herein should only be limited in light of the claims that follow when taken in conjunction with the above description and accompanying drawings.

What is claimed is:

1. A semiconductor apparatus configured to receive a first clock signal and a second clock signal provided externally from the semiconductor apparatus,
wherein the semiconductor apparatus is configured to perform a training operation by itself, the training operation being an operation of internally correcting a phase difference between the first clock signal and the second clock signal by dividing the first clock signal to generate multi-phase signals, detecting phase difference between the second clock signal and the multi-phase signals, and adjusting phases of the multi-phase signals according to a result of the detecting of the phase difference.

2. The semiconductor apparatus of claim 1, wherein the semiconductor apparatus includes:
a dividing circuit configured to divide the first clock signal to generate the multi-phase signals;
a phase detecting circuitry configured to detect the phases of the multi-phase signals with reference to the second clock signal to generate a plurality of phase detection signals;
a phase control circuit configured to generate a phase control signal according to the plurality of phase detection signals; and
a phase adjusting circuit configured to adjust the phases of the multi-phase signals according to the phase control signal to generate phase adjustment signals.

3. The semiconductor apparatus of claim 1, wherein the semiconductor apparatus is configured to adjust the phases of the multi-phase signals by varying, according to the result of the detecting of the phase difference, driving strength of buffers configured to receive the multi-phase signals.

4. The semiconductor apparatus of claim 1, wherein the semiconductor apparatus includes:
a dividing circuit configured to divide the first clock signal to generate first multi-phase signals and second multi-phase signals;
a phase detecting circuitry configured to detect phases of the second multi-phase signals with reference to the second clock signal to generate a plurality of phase detection signals;
a phase control circuit configured to generate a first phase control signal and a second phase control signal according to the plurality of phase detection signals;
a first phase adjusting circuit configured to adjust phases of the first multi-phase signals according to the first phase control signal to generate first phase adjustment signals; and
a second phase adjusting circuit configured to adjust the phases of the second multi-phase signals according to the second phase control signal to generate second phase adjustment signals.

5. The semiconductor apparatus of claim 4, wherein the dividing circuit includes:
a first divider configured to divide the first clock signal to generate the first multi-phase signals;
a second divider configured to divide some signals among the first multi-phase signals to generate some signals among the second multi-phase signals; and
a third divider configured to divide remaining signals among the first multi-phase signals to generate remaining signals among the second multi-phase signals.

6. The semiconductor apparatus of claim 5, wherein the first divider is configured to have a signal transition to a high level and another signal transition to a low level, according to a first edge of the first clock signal to output the transitioned signals as the first multi-phase signals, the first multi-phase signals having a half frequency of the first clock signal and having a predetermined phase difference from each other.

7. The semiconductor apparatus of claim 4,
wherein the phase detecting circuitry includes a plurality of phase detecting circuits, and
wherein each of the plurality of phase detecting circuits includes:
a first phase detector configured to detect the phase of one among the second multi-phase signals according to the second clock signal to generate one among the plurality of phase detection signals;
a delayer configured to delay one among the second multi-phase signals to generate a delayed second multi-phase signal; and
a second phase detector configured to detect a phase of the delayed second multi-phase signal according to the second clock signal to generate another one among the plurality of phase detection signals.

8. The semiconductor apparatus of claim 4,
wherein the first phase adjusting circuit includes a plurality of phase adjustors, and
wherein each of the plurality of phase adjustors is configured to generate one among the first phase adjustment signals according to two multi-phase signals selected to have predetermined phase difference among the first multi-phase signals.

9. The semiconductor apparatus of claim 8,
wherein each of the plurality of phase adjustors includes:
a first buffer configured to drive and output one between the selected two multi-phase signals according to a variable driving strength of the first buffer;
a first variable current source configured to adjust an amount of current output according to a signal bit within the first phase control signal to adjust the driving strength of the first buffer;
a second buffer configured to drive and output the other one between the selected two multi-phase signals according to a variable driving strength of the second buffer; and
a second variable current source configured to adjust an amount of current output according to another signal bit within the first phase control signal to adjust the driving strength of the second buffer, and
wherein output nodes of the first buffer and the second buffer are coupled to a common node.

10. A semiconductor apparatus comprising:
a dividing circuit configured to divide a first clock signal, received externally from the semiconductor apparatus, to generate multi-phase signals;
a phase detecting circuitry configured to detect phases of the multi-phase signals with reference to a second clock signal, received externally from the semiconductor apparatus, to generate a plurality of phase detection signals;
a phase control circuit configured to generate a phase control signal according to the plurality of phase detection signals; and
a phase adjusting circuit configured to adjust the phases of the multi-phase signals according to the phase control signal to generate phase adjustment signals.

11. The semiconductor apparatus of claim 10, wherein the dividing circuit includes:
a first divider configured to divide the first clock signal to generate first multi-phase signals;

a second divider configured to divide some signals among the first multi-phase signals to generate some signals among second multi-phase signals; and a third divider configured to divide remaining signals among the first multi-phase signals to generate remaining signals among the second multi-phase signals.

12. The semiconductor apparatus of claim 11, wherein the first divider is configured to have a signal transition to a high level and another signal transition to a low level, according to a first edge of the first clock signal to output the transitioned signals as the first multi-phase signals, the first multi-phase signals having a half frequency of the first clock signal and having a predetermined phase difference from each other.

13. The semiconductor apparatus of claim 10, wherein the phase detecting circuitry includes a plurality of phase detecting circuits, and wherein each of the plurality of phase detecting circuits includes:

a first phase detector configured to detect the phase of one among the multi-phase signals according to the second clock signal to generate one among the plurality of phase detection signals;

a delayer configured to delay one among the multi-phase signals to generate a delayed multi-phase signal; and a second phase detector configured to detect a phase of the delayed multi-phase signal according to the second clock signal to generate another one among the plurality of phase detection signals.

14. The semiconductor apparatus of claim 10, wherein the phase adjusting circuit includes a plurality of phase adjustors, and wherein each of the plurality of phase adjustors is configured to generate one among the phase adjustment signals according to two multi-phase signals selected to have predetermined phase difference among the multi-phase signals.

15. The semiconductor apparatus of claim 14, wherein the each of the plurality of phase adjustors includes:

a first buffer configured to drive and output one between the selected two multi-phase signals according to a variable driving strength of the first buffer;

a first variable current source configured to adjust an amount of current output according to a signal bit within the phase control signal to adjust the driving strength of the first buffer;

a second buffer configured to drive and output the other one between the selected two multi-phase signals according to a variable driving strength of the second buffer; and a second variable current source configured to adjust an amount of current output according to another signal bit within the phase control signal to adjust the driving strength of the second buffer, and wherein output nodes of the first buffer and the second buffer are coupled to a common node.

16. The semiconductor apparatus of claim 10, wherein the phase adjustment signals are utilized for at least one of a read operation and a write operation of the semiconductor apparatus.

17. A data processing system comprising:

a controller configured to output a first clock signal and a second clock signal; and a semiconductor apparatus including a self-training circuit configured to perform a self-training operation internally within the semiconductor apparatus without transmitting a signal to the controller for execution of the training operation, the self-training operation being an operation of internally correcting a phase difference between the first clock signal and the second clock signal by dividing the first clock signal to generate multi-phase signals, detecting phase difference between the second clock signal and the multi-phase signals, and adjusting phases of the multi-phase signals according to a result of the detecting of the phase difference.

18. The data processing system of claim 17, wherein the self-training operation is performed, without an external command received by the semiconductor apparatus from the controller, at a predetermined timing of the semiconductor apparatus, performed according to a command of the controller or performed at a predetermined timing of the semiconductor apparatus and when a command of the controller is provided.

19. The data processing system of claim 17, wherein the self-training circuit includes:

a dividing circuit configured to divide the first clock signal to generate multi-phase signals;

a phase detecting circuitry configured to detect the phases of the multi-phase signals with reference to the second clock signal to generate a plurality of phase detection signals;

a phase control circuit configured to generate a phase control signal according to the plurality of phase detection signals; and a phase adjusting circuit configured to adjust the phases of the multi-phase signals according to the phase control signal to generate phase adjustment signals.

20. The data processing system of claim 19, wherein the dividing circuit includes:

a first divider configured to divide the first clock signal to generate first multi-phase signals;

a second divider configured to divide some signals among the first multi-phase signals to generate some signals among second multi-phase signals; and a third divider configured to divide remaining signals among the first multi-phase signals to generate remaining signals among the second multi-phase signals.

21. The data processing system of claim 19, wherein the phase detecting circuitry includes a plurality of phase detecting circuits, and wherein each of the plurality of phase detecting circuits includes:

a first phase detector configured to detect the phase of one among the multi-phase signals according to the second clock signal to generate one among the plurality of phase detection signals;

a delayer configured to delay one among the multi-phase signals to generate a delayed multi-phase signal; and a second phase detector configured to detect a phase of the delayed multi-phase signal according to the second clock signal to generate another one among the plurality of phase detection signals.

22. The data processing system of claim 19, wherein the phase adjusting circuit includes a plurality of phase adjustors, and wherein each of the plurality of phase adjustors is configured to generate one among the phase adjustment signals according to two multi-phase signals selected to have predetermined phase difference among the multi-phase signals.

23. The data processing system of claim 22, wherein each of the plurality of phase adjustors includes:

a first buffer configured to drive and output one between the selected two multi-phase signals according to a variable driving strength of the first buffer;

a first variable current source configured to adjust an amount of current output according to a signal bit within the phase control signal to adjust the driving strength of the first buffer;

a second buffer configured to drive and output the other one between the selected two multi-phase signals according to a variable driving strength of the second buffer; and a second variable current source configured to adjust an amount of current output according to another signal bit within the phase control signal to adjust the driving strength of the second buffer, and wherein output nodes of the first buffer and the second buffer are coupled to a common node.

24. The data processing system of claim 19, wherein the phase adjustment signals are utilized for at least one of a read operation and a write operation of the semiconductor apparatus.

* * * * *